(12) United States Patent
Matsui et al.

(10) Patent No.: US 7,979,101 B2
(45) Date of Patent: Jul. 12, 2011

(54) ELECTROMAGNETIC WAVE DETECTION ELEMENT AND ELECTROMAGNETIC WAVE DETECTION DEVICE USING THE SAME

(75) Inventors: Toshiaki Matsui, Koganei (JP); Hiroshi Ohta, Koganei (JP); Akira Kawakami, Koganei (JP)

(73) Assignee: National Institute of Information and Communications Technology, Incorporated Administrative Agency, Koganei-shi (JP)

( * ) Notice: Subject to any disclaimer, the term of this patent is extended or adjusted under 35 U.S.C. 154(b) by 878 days.

(21) Appl. No.: 11/576,745

(22) PCT Filed: Oct. 4, 2005

(86) PCT No.: PCT/JP2005/018722
§ 371 (c)(1),
(2), (4) Date: Nov. 30, 2007

(87) PCT Pub. No.: WO2006/038706
PCT Pub. Date: Apr. 13, 2006

(65) Prior Publication Data
US 2008/0067500 A1 Mar. 20, 2008

(30) Foreign Application Priority Data
Oct. 5, 2004 (JP) ................................. 2004-292766

(51) Int. Cl.
*H01L 39/22* (2006.01)
*G01R 29/00* (2006.01)
(52) U.S. Cl. ........ 505/190; 505/191; 505/329; 505/702; 257/34; 257/E27.007; 257/E29.142; 257/E39.014; 427/62
(58) Field of Classification Search .................. 505/190, 505/191, 210, 329, 702; 257/34, E27.007, 257/E29.142, E39.014; 47/62
See application file for complete search history.

(56) References Cited

U.S. PATENT DOCUMENTS
4,494,131 A * 1/1985 Ohta ............................... 257/34
(Continued)

FOREIGN PATENT DOCUMENTS
DE          31 42 949 A1     6/1982
(Continued)

OTHER PUBLICATIONS

Toshiaki Matsui, et al., "Low-Voltage Negative-Resistance Mixers of Nano-Meter SNS Junctions", IEEE Transactions on Applied Superconductivity, vol. 11, No. 1, Mar. 2001, pp. 191-195.

(Continued)

*Primary Examiner* — Stanley Silverman
*Assistant Examiner* — Kallambella Vijayakumar
(74) *Attorney, Agent, or Firm* — Oblon, Spivak, McClelland, Maier & Neustadt, L.L.P.

(57) ABSTRACT

It is possible to improve the negative resistance characteristic that can be expected when an SNS (superconductor-normal conductor-superconductor) structure is used as a structure unit for series connection. On the top of a first superconducting electrode, a second superconducting electrode is superimposed so as to sandwich an insulation film between the first and second superconducting electrodes, with parts of cross sections of the second superconducting electrode and insulation film placed on the top. A normal superconducting line electrically connects the first and second superconducting electrodes passing along the cross section of the insulation film, thereby constituting a structure unit having a single weak link. A plurality of such structure units connected in series are prepared. At the both ends of the series the first or second superconducting electrode is an element connected to a leading line. The structure units are arranged so that the cross sections of the insulation films along which the normal conducting line passes are arranged in the sale direction.

11 Claims, 13 Drawing Sheets

U.S. PATENT DOCUMENTS 4,539,741 A * 9/1985 Ohta .............................. 427/63
5,109,164 A    4/1992 Matsui

FOREIGN PATENT DOCUMENTS

| | | |
|---|---|---|
| FR | 2 493 605 | 5/1982 |
| JP | 54-89590 | 7/1979 |
| JP | 57-78187 | 5/1982 |
| JP | 60-130182 | 7/1985 |
| JP | 3-110877 | 5/1991 |
| JP | 4-130676 | 5/1992 |
| JP | 6-53762 | 2/1994 |
| JP | 6-252456 | 9/1994 |

OTHER PUBLICATIONS

Toshiaki Matsui, et al., "Millimeter-and Submillimeter-Wave Negative Resistance SNS Mixers", IEEE Transactions on Applied Superconductivity, vol. 9, No. 2, Jun. 1999, pp. 4452-4455.

Hiroshi Ohta, et al., "Short Weak Links for 115 $GH_z$ Mixers", IEEE Transactions on Magnetics, vol. MAG-19, No. 3, May 1983, pp. 601-604.

* cited by examiner (a)

(b)

US 7,979,101 B2

ELECTROMAGNETIC WAVE DETECTION ELEMENT AND ELECTROMAGNETIC WAVE DETECTION DEVICE USING THE SAME

TECHNICAL FIELD

This invention relates to an electromagnetic wave detection element possessing an element structure i.e. SNS (superconductor-normal conductor-superconductor) or SS'S (superconductor-superconductor-superconductor) structure, which, when used as an amplifier, enables increasing the dynamic range of negative resistance as compared with the conventional equivalent and, when used as an electromagnetic wave detector, enables enhancing the detection sensitivity and to an electromagnetic wave detector apparatus using the element.

BACKGROUND ART

The current transport of the mesoscopic SNS junction, as described in T. Matsui and H. Ohta "Low-Voltage Negative Resistance Mixers of Nano-Meter SNS Junctions" (IEEE TRANSACTIONS ON APPLIED SUPERCONDUCTIVITY, VOL. 11, NO. 1, pp. 191-195, MARCH 2001) (hereinafter referred to as "Non-Patent Document 1") or T. Matsui and H. Ohta. "Millimeter-and Submillimeter-Wave Negative Resistance SNS Mixers" (IEEE TRANSACTIONS ON APPLIED SUPERCONDUCTIVITY, VOL. 9 NO. 2, pp. 191-195, JUNE 1999) (hereinafter referred to as "NonPatent Document 2"), is expressed by the resonance phenomenon of the multiple-Andreev reflections and the energy gap that occurs in the two SN interfaces. It is known that when the voltage is 0 V as shown in FIG. 1, namely in the voltage region infinitely approximating zero, the voltage-current characteristic of the mesoscopic SNS structure having an extremely small N region (or S' region) as a junction area is transported by an infinite number of times (a very large number of times) of multiple-Andreev reflections and the superconducting electron-pair current assumes the largest amplitude and that when the voltage is in a finite state, the superconducting electron-pair current which quickly decreases in proportion as the voltage increases and the quasi-particle current which increases in accordance with voltage are synthesized and the negative resistance part reflecting the decrease of the superconducting electron-pair current occurs in the low voltage region. The low-noise amplifier that utilizes this negative resistance is disclosed in JP-A HEI 6-53762 (hereinafter referred to as "Patent Document 1").

The transportation of current in the SNS element while the element is in the state of such low voltage as extremely approximating zero V is expressed by the formula (7) in Non-Patent Document 2. The amplitude of this electron-pair current reflects the multiple-Andreev reflections which quickly decrease in accordance as the bias voltage increases and, in the low voltage region having the bias voltage in the neighborhood of 0 V assumes a characteristic possessing negative resistance as shown in FIG. 1.

When an element possessing this characteristic is disposed in series connection, the superconducting electron-pair current that allows flow of the bias voltage at 0 V makes no change. The electron-pair current in the low-voltage region and the quasi-particle current flowing in the region exceeding 0 V, however, are shifted to a large voltage region depending on the number of SNS elements disposed in series connection. This is because the bias voltage is distributed by the series connection to the component SNS elements. As a result the voltage range of the negative resistance region part is expanded as shown in FIG. 2 and the dynamic range thereof is also expanded. The DC bias of the element that exhibits the negative resistance of this sort necessitates use of a voltage source (zero output resistance) therefor. By having the voltage bias set in the negative resistance region of the SNS element similarly to the structure of the Esaki diode known as a diode capable of exhibiting negative resistance it is rendered possible to extract the high-frequency current flowing in the element as a high-frequency current amplified by the large negative resistance. Then by having a biased SNS element disposed in the negative resistance voltage region in the resonant structure possessing a specific resonance frequency, it is rendered possible to realize a high-frequency oscillator capable of reaching even more than several hundred GHz, enable the negative resistance region dilated by serialization to exhibit a high output characteristic, and acquire a great advantage as a superconductor element restricted within a very low electric power region despite extremely low noise. Thus, in this invention, the negative resistance region of the SNS element begins at the position of breaking the state of zero voltage unlike the case of a tunnel diode wherein the negative resistance region is inevitably shifted toward high voltage depending on the number of series. Since the negative resistance region is spread out in a wide voltage region by the series connection, the condition for setting the bias in the neighborhood of the most sensitive zero voltage region becomes the voltage position in a practicable range. Though the receivers of millimeter wavelength to submillimeter wavelength bands assume grave necessity of satisfying the condition for matching the impedance of the whole element with the electromagnetic waves, they are at an advantage in easily accomplishing a high impedance condition due to series connection and are capable of unusually effectively enhancing the practical technical task as compared with a sole element.

In the case of the tunnel diode, as the characteristic manifested by an individual piece is indicated by a dotted line and the characteristic manifested by two pieces in series connection is indicated by a solid line in FIG. 4, the dynamic range of electric current in the part manifesting negative resistance does not change, whereas the negative resistance region widens in proportion to the number of series and is inevitably shifted as a whole toward high voltage.

Though series connection of the SNS element has been heretofore tried, as shown in FIG. 4 through FIG. 6 of H. Ohta et al. "SHORT WEAK LINKS FOR 115 GHz MIXERS" (IEEE TRANSACTIONS ON MAGNETICS, Vol. MAG-19 NO. 3, pp. 601-604 JUNE 1983) (hereinafter referred to as "Non-Patent Document 3"), the structure of Non-Patent Document 3 has never succeeded in exhibiting a negative resistance characteristic. The cause for this failure, as ascertained by the present inventors is that the finish of the narrow line of normal conduction serving to connect the first and second superconductors is destitute of processing controllability because the finish of the junction area of normal conduction of the mesoscopic small SNS junction structure exerts a strong influence on the property.

As described above, the SNS element unlike the conventional tunnel diode, is enabled by series connection to acquire improvement in the negative resistance property thereof. To date, the series connection has never been handled from this point of view and none of the conventional cases of implementing series connection has succeeded in acquiring a negative resistance property.

An element having two-dimensionally disposed superconductors mutually linked with weak links as disclosed in U.S. Pat. No. 5,109,164 (hereinafter referred to as "Patent Document 2") has been known. The superconductors disclosed herein, however, have varying sizes and the links keeping the superconductors in weak link have directions of arbitrary selection. Moreover, since the plurality of superconductors linked in all these directions are so disposed as to constitute a two-dimensional structure the position that has chanced to incite a change of proper evades precise location. Further, the negative resistance in the low-voltage region that is accepted as being characteristic of the SNS junction has never beet realized with satisfactory reproducibility.

DISCLOSURE OF THE INVENTION

In the SNS element that has undergone series connection, when the narrow line of normal conduction serving to connect the first and second conductors happens to impart dispersion to the shape of the junction part, the greatest value of the superconducting current suffers occurrence of dispersion and the characteristic in the course of series connection inevitably becomes the smallest value of superconducting current of them. Moreover, since the individual junctions suffer dispersion of resistance the potential distribution also becomes destitute of uniformity and the operation as a whole encounters difficulty in deriving the current transport property of the SNS aimed at. This invention therefore contemplates suppressing the dispersion of the superconducting current and maintaining the largest value of the superconducting current as the characteristic of series connection at the highest possible level. This invention therefore is directed to an electromagnetic wave detection element that is characterized as follows and to an electromagnetic wave detector using this element.

Specifically, this invention provides as the first aspect thereof an element comprising a plurality of structure units each comprising a flat electrically insulating substrate, a first superconducting electrode disposed on the substrate a second superconducting electrode opposed to an upper part of the first superconducting electrode, an insulating film not less than 5 nm and not more than 10 nm in thickness and sandwiched between the first and second superconducting electrodes, with parts of cross sections of the second superconducting electrode and insulating film formed on the upper part of the first superconducting electrode and a normal superconducting line not more than 100 nm in width not more than 100 nm in thickness and passing just once through the cross sections of the second superconducting electrode and insulating film to form a sole weak link and establish electric connection of the first and second superconducting electrodes, wherein the first superconducting electrode of each of the structure units is serially connected to an adjacent second superconducting electrode the first or second superconducting electrode of opposite end units are connected leading lines and the cross sections of the insulating films allowing passage of the normal conducting lines are disposed so as to face a same direction with respect to the plurality of structure units laid throughout between the leading lines.

Owing to the fact that the same effect as mentioned above can be realized by using in the place of the normal conducting line a superconducting line that is made refined till the first superconducting electrode or the second superconducting electrode and the band structure thereof are varied this invention provides as the second aspect thereof an element comprising a plurality of structure units each comprising a flat substrate, a first superconducting electrode disposed on the substrate, a second superconducting electrode opposed to an upper part of the first superconducting electrode an insulating film not less than 5 nm and not more than 10 nm in thickness and sandwiched between the first and second superconducting electrodes, with parts of cross sections of the second superconducting electrode and insulating film formed on the upper part of the first superconducting electrode, and a superconducting line not more than 100 nm in width not more than 100 nm in thickness and passing just once through the cross sections of the second superconducting electrode and insulating film to form a sole weak link and establish electric connection of the first and second superconducting electrodes, wherein the first superconducting electrode of each of the structure units is serially connected to an adjacent second superconducting electrode the first or second superconducting electrodes of opposite end units are connected to leading lines, and the cross sections of the insulating films allowing passage of the superconducting lines are disposed so as to face a same direction with respect to the plurality of structure units laid throughout between the leading lines.

Another aspect of this invention resides in enabling the device and the process of fabrication to be simplified by having the first and second superconducting electrodes made of a same material.

Still another aspect of this invention resides in having the superconducting line and the first and second superconducting electrodes made of a same material. This is at an advantage in simplifying the device and the process of fabrication notwithstanding the superconducting line fated to constitute a weak link automatically acquires a varied material property because it is manufactured in a thin and narrow shape as described above.

Yet another aspect of this invention resides in causing the shortest length of the normal conducting line or the superconducting line required in connecting the first and second superconducting electrodes to become 0.3 to 6 times the superconducting coherent length. This is because this definition of the length is necessary for realizing conspicuous negative resistance from the current transport property due to the multiple-Andreev reflections in the two SN interfaces at the opposite ends of the N region.

Another aspect of this invention resides in giving the weak link a length in the range of 5 to 30 nm, a width in the range of 5 to 250 nm and a thickness in the range of 5 to 30 nm. The specified ranges are realistic conditions of process size allowing acquisition of the aforementioned effect as a mesoscopic SNS element and are necessary for the purpose of realizing a conspicuous negative resistance.

Still another aspect of this invention resides in allowing the first superconducting electrode and the second superconducting electrode to be formed in sizes included in a circle having a radius of not more than 5 times the wavelength of the electromagnetic wave to be detected. This restrictions in the manufacture of a detector of a prescribed surface areas is intended to enable the detector to over a large surface area with high sensitivity by giving the individual component elements a size small enough to perform detection with high sensitivity and causing these numerous component elements to be serially connected till they total the prescribed area. The SNS element is expected to manifest a veritably excellent performance as a detector for electromagnetic wave form millimeter-wave to X ray, γ ray and other high-energy particle rays. The criterions of the wavelength and the electrode size involved herein are decided by the fact that the energy of the electromagnetic wave subjected to detection belongs in the electromagnetic wave, infrared ray, ultraviolet light, X ray, γ ray and other high-energy particle rays having short wavelengths in excess of the energy gap of a superconductor and they are intended to prevent this energy from becoming unduly large as compared with the equivalent wavelength of the electromagnetic wave or the high-energy particle ray and resulting in degrading the resolution and the sensitivity. When the electromagnetic wave of a short wavelength having a larger energy than the energy gap of a superconductor is injected into the superconductor, excitation of numerous quasi-particles ensues. If the superconducting electrode is excessively large, the probability that the electromagnetic wave is inevitably relaxed before being detected as a change of conductance of the SNS element will grow and will result in degrading the sensitivity of detection. This is a dilemma between the increase of surface area and the increase of sensitivity of detection that confronts ordinary photoconductive detectors. In the case of the SNS element of series connection, the quasi-particle excitation that occurs at any part of the electrodes of the array of serially connected SNS junction elements is detected as a change of conductance of the whole serially connected elements. By selecting the electrode size and the number of series, it is rendered possible to realize an ultrahigh sensitivity detector having an arbitrary surface area. This detector is further endowed with such a high speed of response as several hundred GHz. In the far infrared to infrared regions, fully satisfactory detection of a single photon can be realized. Proper selection of the electrode size and the number of series enables realizing a detector befitting such elementary particles as neutrino, proton and neutron.

Another aspect of this invention resides in allowing use of either a normal conductor or a superconductor as the material for constituting a weak link. For example, niobium, niobium nitride, copper, gold, tungsten, titanium, aluminum and bismuth, and normal conductor or superconductor compounds containing at least one kind of these metals are available as the material.

Still another aspect of this invention resides in implementing producing the second superconducting electrode and the normal conducting line or superconducting line for forming a weak link using a vector-scanning electron-beam exposure apparatus. This fabrication follows a process wherein the scanning directions are perpendicular mutually. The use of this process is necessary for the sake of suppressing dispersion of the properties of the electromagnetic detection element.

Yet another aspect of this invention resides in implementing one-dimensional or two-dimensional measurement of the target electromagnetic wave by arraying the electromagnetic wave detection elements one-dimensionally or two-dimensionally, retaining them under a bias voltage in a negative resistance region, irradiating them with an electromagnetic wave subjected to the measurement and sequentially reading the voltage-current characteristic of the individual electromagnetic wave detection elements via a sense amplifier. By arraying the elements one-dimensionally or two-dimensionally as described above and reading the electric signals thereof it is rendered possible t realize an electromagnetic wave detector that serves as a one-dimensional or two-dimensional image sensor of high sensitivity.

Another aspect of this invention resides in causing the electromagnetic wave detection element to detect an electromagnetic wave in a state generating a strong non-equilibrium state fated to become a critical state in the extremely small couplings region of the superconducting line in consequence of the linking with an electromagnetic wave signal while the superconducting line linking the first and second superconducting electrodes is retained in the superconducting state of a temperature approximating the superconducting transition temperature. By retaining in the state described above the superconducting line linking in the structure of the electromagnetic wave detection element, it is rendered feasible to realize an electromagnetic wave detector that is capable of detecting an electromagnetic wave with high sensitivity.

Still another aspect of this invention resides in causing the electromagnetic wave detection element to supply a received signal and a local oscillator signal generated on the receiver side in an overlapped state to a bias voltage combine this supply with the adjustment of the electric power of the local oscillator signal retain the superconducting line linking the first and second superconducting electrodes in a superconducting state of a temperature approximating the superconducting transition temperature generate a strong non-equilibrium state fated to become a critical state in the extremely small coupling region in consequence of the linking with an electromagnetic wave signal, mix the relevant signals by using the nonlinear response property of the electromagnetic wave detection element, select from the mixed signals the difference frequency between the received signal and the local oscillator signal and amplify the difference frequency. Consequently, an electromagnetic wave detector that is capable of detecting an electromagnetic wave in the heterodyne form with high sensitivity.

This invention is directed to realizing improvement in and concerning the negative resistance property that can be expected in implementing series connection of SNS structures as structure units. According to this invention, when the SNS structure is used as an amplifier, the dynamic range of negative resistance can be widened as compared with the conventional structure and, as a result the dynamic range of the amplifier is enlarged. Further, by implementing series connection of a multiplicity of fine SNS structures, it is rendered possible to realize a photon detector, namely an ultrahigh sensitivity detector of a large surface area befitting short-wavelength electromagnetic waves and high-energy particle rays. Since the SNS element itself is such an element as possesses a speed of response of the class of several hundred GHz, it can be expected to be made suitable by arrangement in an array for application to an ultrahigh-speed high-sensitivity imaging sensor.

BEST MODE FOR CARRYING OUT THE INVENTION

Figure 1:
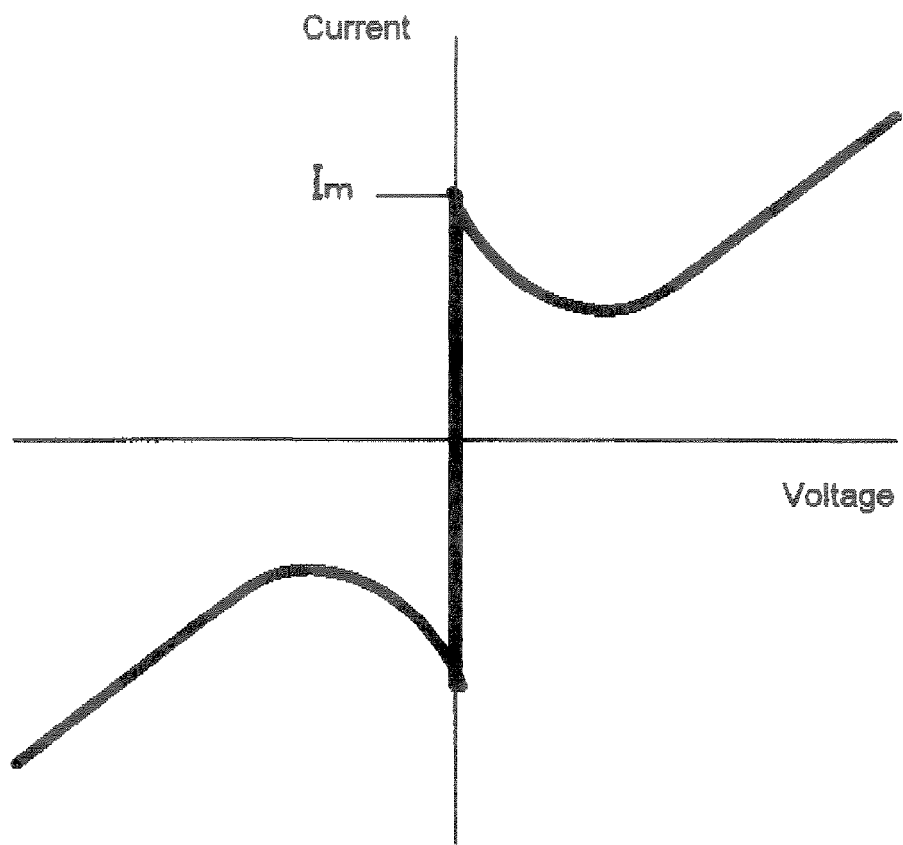
FIG. 1 is a drawing illustrating the voltage-current characteristic of an SNS structure
Figure 1:
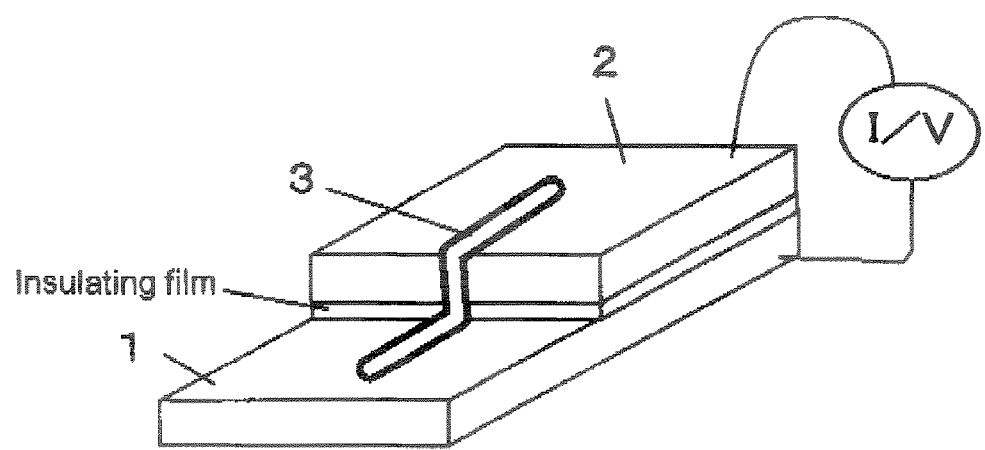
Figure 2:
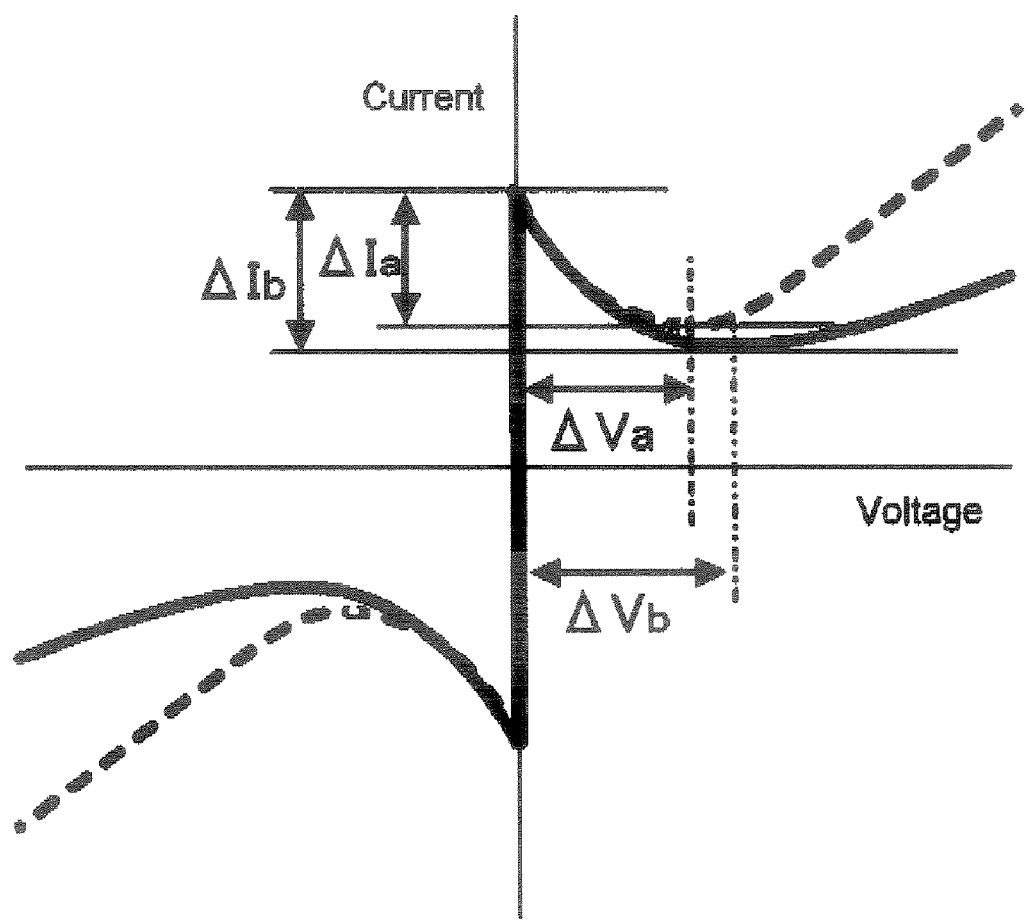
FIG. 2 is a drawing illustrating the voltage current characteristic of a series-connection SNS structure.
Figure 3:
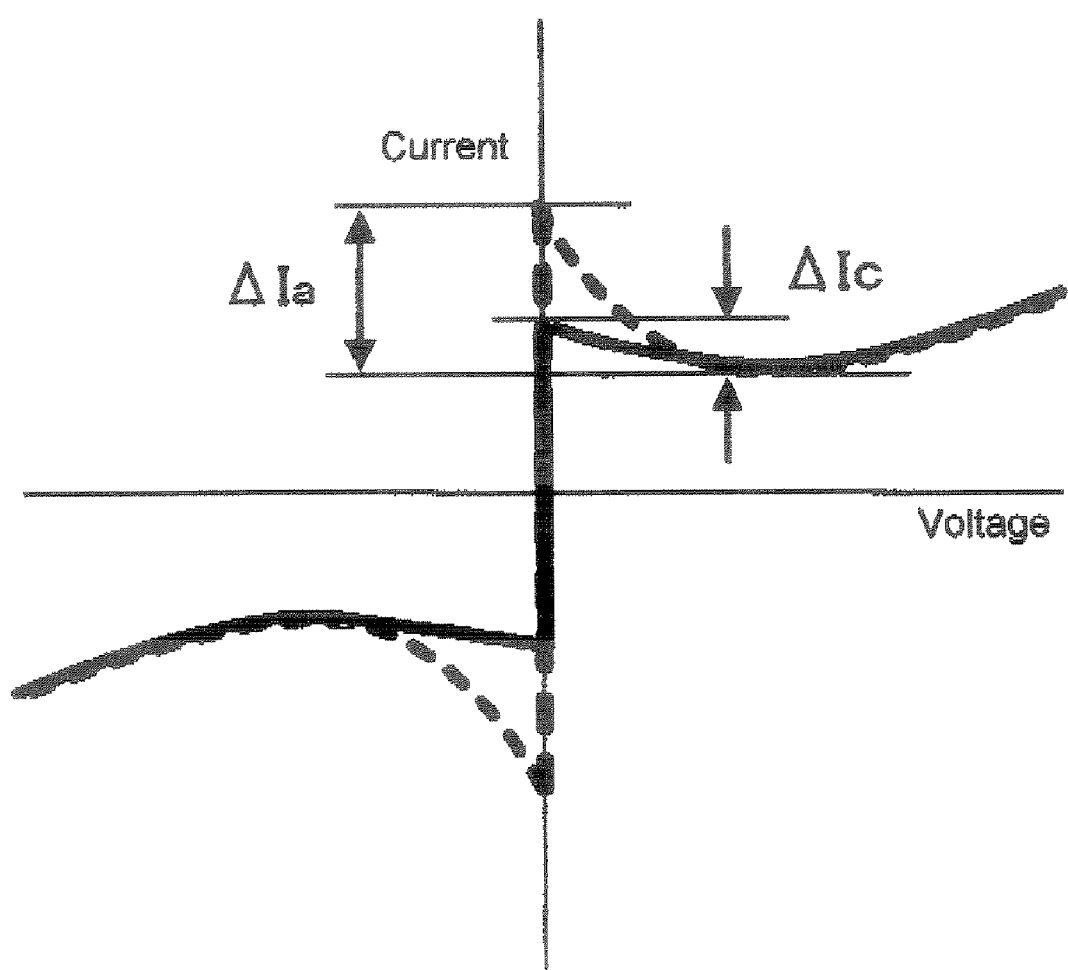
FIG. 3 is a drawing illustrating the proper of a tunnel diode compared with this invention.

Now, the embodiments of this invention will be described in detail below by reference to the accompanying drawings. In the following descriptions the units fulfilling same functions or similar functions will be denoted by the same reference numerals unless there exists a special reason. First, the embodiment of this invention will be described by reference to FIG. 1.

Embodiment 1

An example of the process adopted for the formation of an electromagnetic wave detection element of this invention will be shown below.

Figure 5:
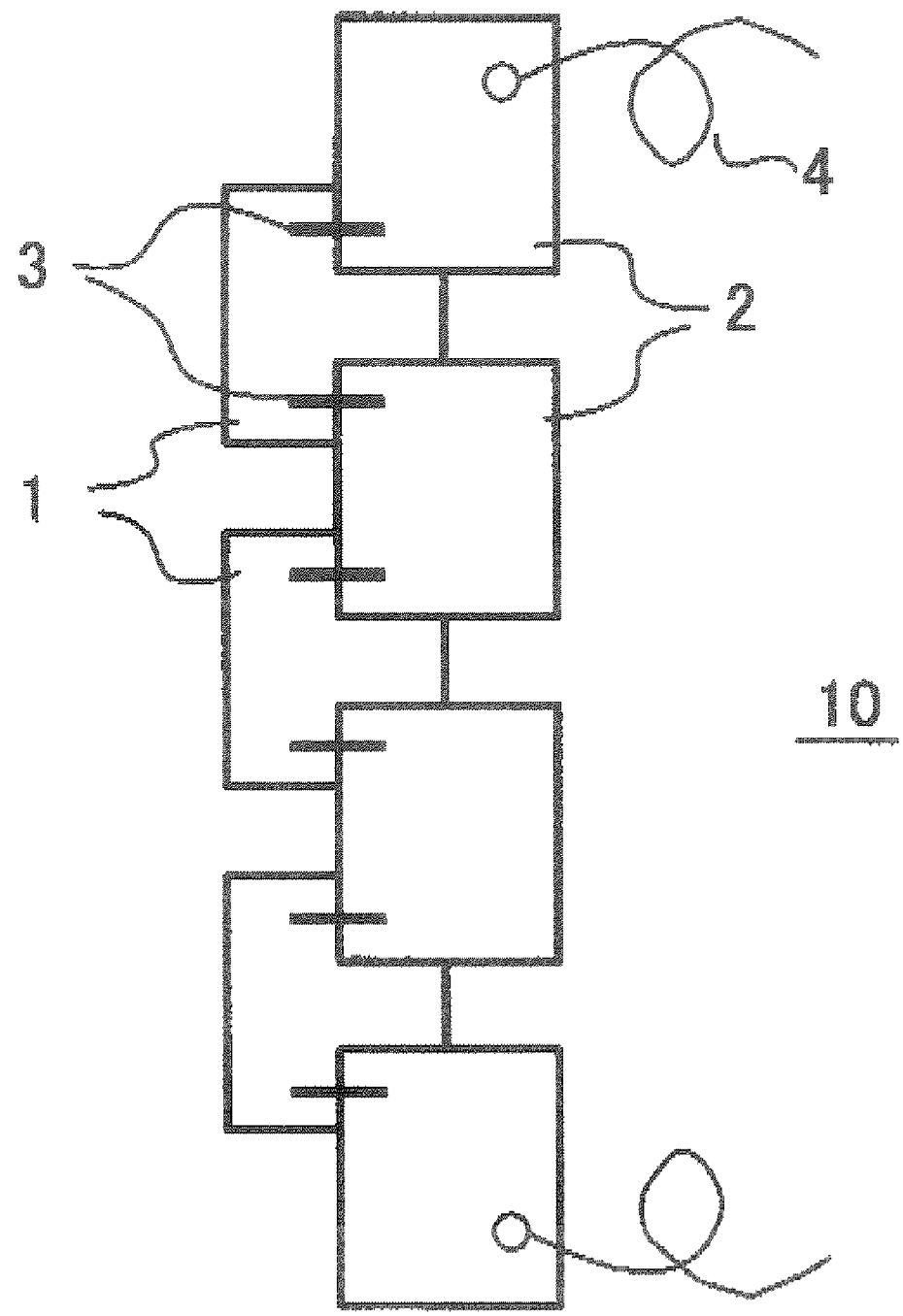
FIG. 5 is a drawing illustrating a preferred arrangement of narrow lines used for weak link in the case of series connection.

(1) On a substrate having an oxide film formed by thermal oxidation or deposition on the surface of a flat substrates such as a silicon substrate, films of a superconductor 1 such as niobium, niobium nitride, $MgB_2$ or an oxide-based superconducting material are formed in a film thickness of 100 nm in an arrangement illustrated in FIG. 5 and are patterned by the ordinary lithography technique. This thickness nay vary in the range of 50 nm to 300 nm. Since the superconductor 1 is fated to become a first electrode during the patterning process, the size thereof prefers to be such that the upper limit thereof will be contained in a circle having a radius of not more than 5 times the wavelength of an electromagnetic wave to be detected and the lower limit of the whole size embracing electromagnetic waves and particle rays having a higher energy that the ultraviolet light will be in the approximate range of 1 to 5 µm.

(2) Next, an insulating film is formed in a film thickness of 5 to 13 nm by thermal oxidation or deposition on the superconductor 1 resulting from the patterning.

Figure 6:
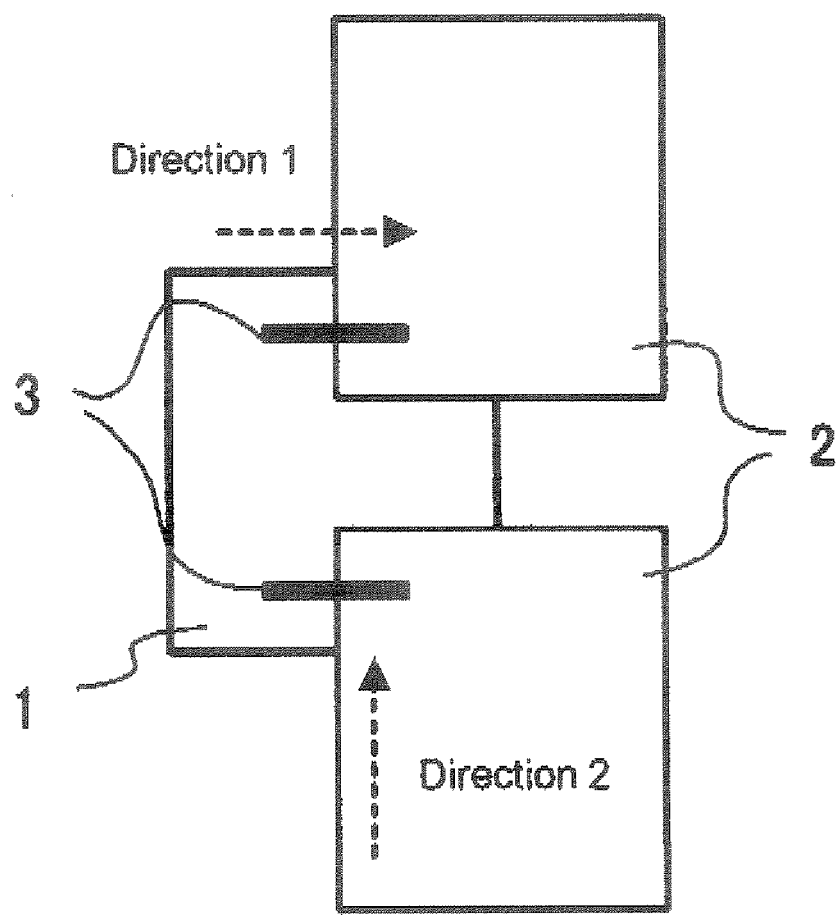
FIG. 6 is a drawing illustrating an example of scanning directions of EB exposure in the fabrication process.

(3) Then, films of a superconductor 2 made of niobium, niobium nitride, $MgB_2$ or an oxide-based superconducting material is formed in a film thickness of 100 nm and patterned by the lithography technique using an electron beam (EB) exposure. This exposure involves vector scanning that is implemented in a direction perpendicular to a narrow line 3 used for weak link similarly to the direction 2 of FIG. 6. This superconductor film 2 is so patterned that it may partly overlie the pattern of the superconductor film 1 as illustrated in FIG. 5. Prior to this patterning the insulating film is removed. Since the superconductor 2 is fated to become a second electrode during the patterning process, the size thereof exceeds the approximate range of 1 to 5 µm. When the wavelength of the electromagnetic wave to be detected is greater than the infrared light, the size prefers to be contained in a circle having a radius of not more than 5 times the wavelength of the electromagnetic wave.

(4) Then, a film of niobium, niobium nitride, copper, gold, tungsten, titanium, aluminum $MgB_2$ or an oxide-based superconducting material or a film of bismuth is firmed thereon in a film thickness of 5 to 30 nm, patterned in a width of 15 to 250 nm by the lithography technique using an electron beam exposure to form bridge lines and consequently enabled to realize weak link. As described above in the present patterning process, the scanning is made in a direction perpendicular to the scanning direction used in the EB exposure of the superconductor 2 film. On this occasion, the smallest length of the normal conducting line or the superconducting line required in linking the first and second superconducting electrodes prefers to be in the range of 0.3 to 6 times the superconducting coherent length. These bridge lines may be so formed of a plurality of closely approximating extremely thin lines as to suit use for a single weak link. The bridge lines prefer to be one-dimensional conductor.

(5) Then, a protecting film is formed when necessary, furnished with a window enabling a leading line 4 to be laid therethrough and fitted with the leading line 4.

Naturally, this element is operated at a low temperature falling below the superconducting transition temperature of the superconducting electrode that is intended to manifest the superconducting phenomenon.

Further, when the superconducting electrode is obtained by combining a metallic $MgB_2$ abounding in Tc and an oxide-based superconductor, the electromagnetic wave detection element configured with the SNS junction capable of operating at 10 K to 100 K, a level easily attained by a refrigerator, can be realized.

Figure 4:
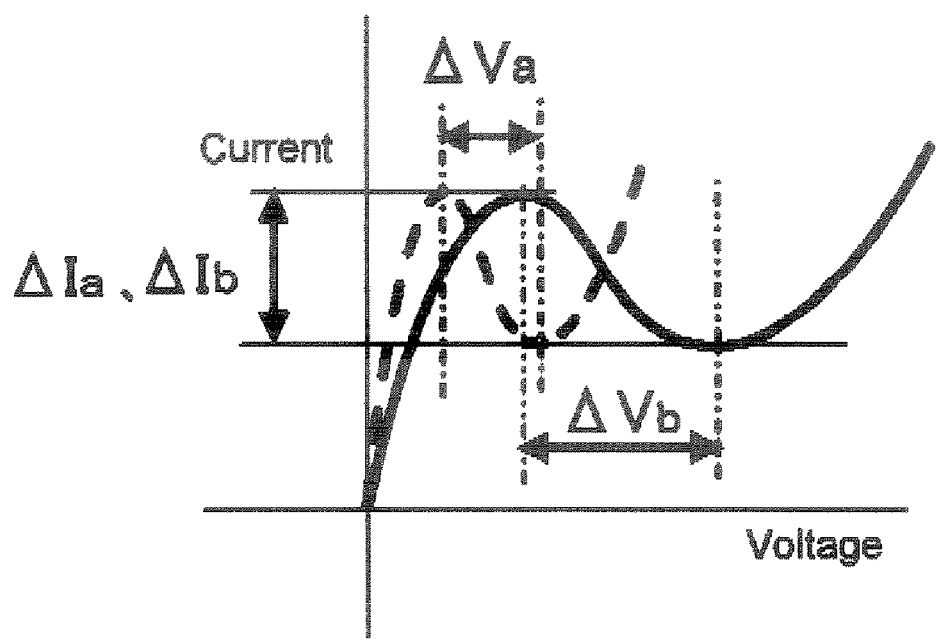
FIG. 4 is a drawing illustrating the property deterioration due to the property dispersion of a series-correction SNS structure.
Figure 7:
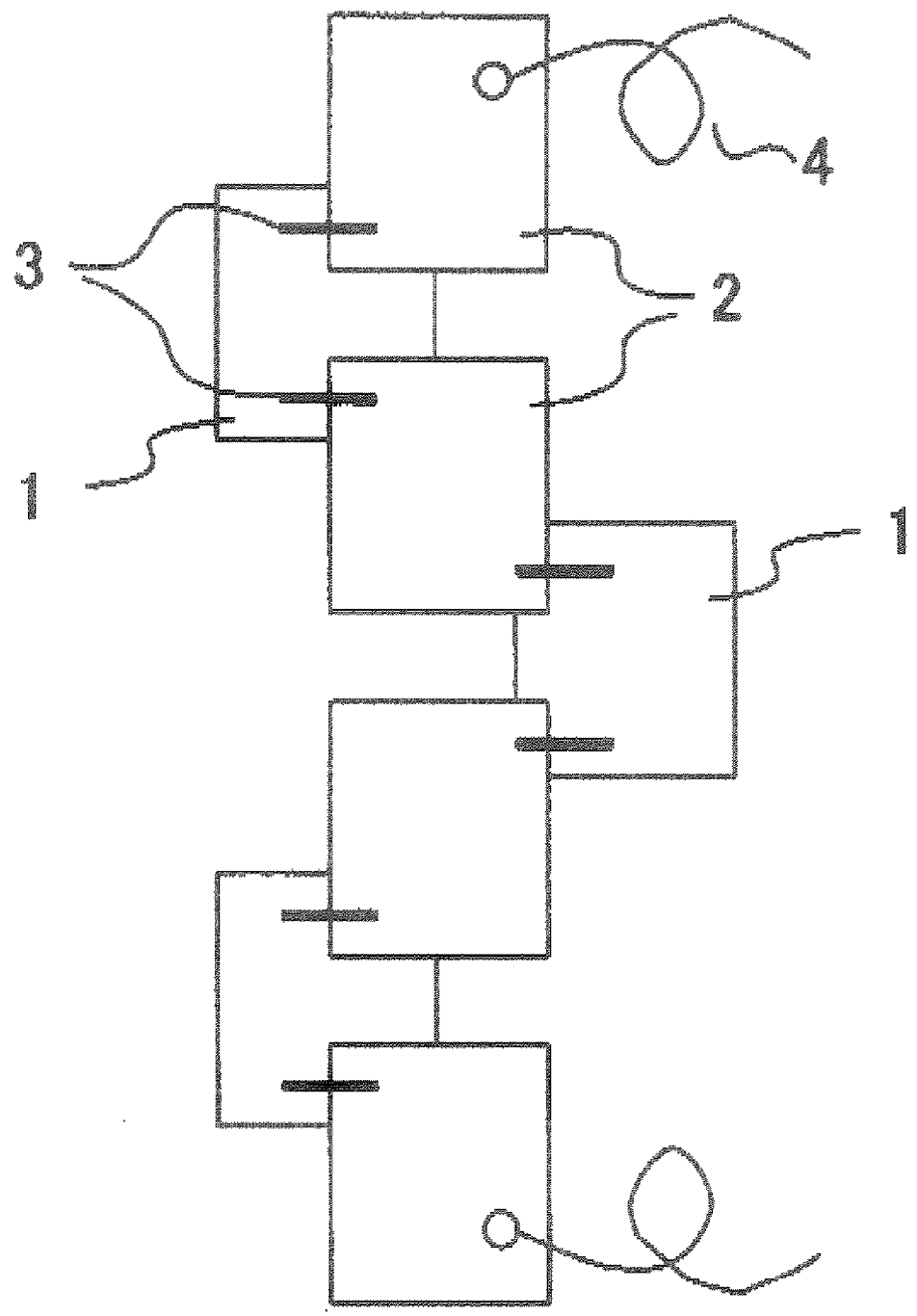
FIG. 7 is a drawing illustrating an unpreferred arrangement of narrow lines used for weak link in the case of series connection.

In the process of fabrication described above, the fact that the narrow lines 3 are disposed on only the side faces in the same direction of the pattern of the superconductor 2 films proves to be important where series connection is contemplated. When the narrow lines 3 are disposed on the relative side faces of the pattern of the superconductor 2 films in such an arrangement that they may stagger bilaterally in the pattern of the superconductor 2 films as illustrated in FIG. 7, for example, the individual SNS elements acquire such properties that the largest values of the superconducting current will be inevitably dispersed as indicated by the dotted line and the solid line in FIG. 4. Further, the largest values of the superconducting current in series connection become the smallest of all the largest values. It is known that the dispersion of this nature originates in the underlayer pattern dependency of the secondary electron distribution in the EB exposure the positional misalignment during the course of exposure, the pattern dependency of etching and so on.

When a plurality of SNS and SS'S junctions according to this invention are connected and used as electromagnetic wave detectors these detectors can be broadly classified under the following two cases. In the first case, the electromagnetic wave subjected to detection has a low frequency and the energy of the electromagnetic wave is smaller than the energy gap between the first and second superconducting electrodes. In this case, by implementing series connection of a plurality of SNS (or SS'S) junctions it is rendered possible to realize heightening resistance, lowering capacity and heightening dynamic range as well for the sake of securing impedance matching and utilize the amplifying action due to the negative resistance region simultaneously with nonlinearity.

Further, in the utilization of the high impedance direct detection, by arraying series connections, it is rendered possible to realize necessary high impedance conditions.

When the change in the largest electric current under zero voltage is used for the detection of an electromagnetic wave in the case of using an electromagnetic wave detection element having a frequency band of micro wave to submillimeter-wave of small electromagnetic wave energy, the magnitude of 3 µm to 100 µm which is sufficiently small as compared with the wavelength and which is realized by the conventional photolithography proves to be suitable.

Figure 12:
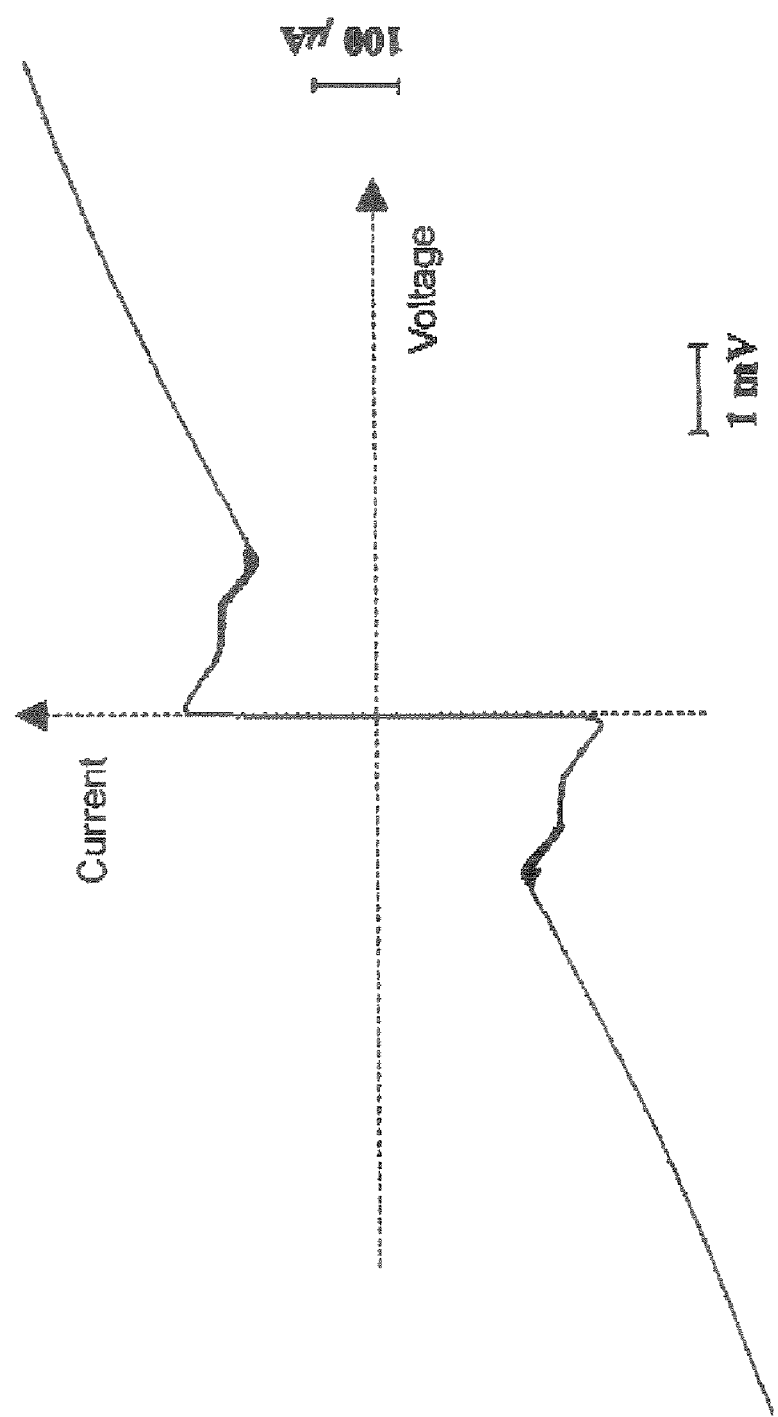
FIG. 12 is a drawing illustrating an example of experimental measurement.

An example of actual measurement is illustrated in FIG. 12. This example has weak link formed in a total of five steps and has leading lines disposed on the superconductors 1 and 2 respectively. The electrodes and the weak links are formed by vapor deposition of niobium nitride. FIG. 12 depicts the current-voltage characteristic of a mesoscopic SNS junction.

Embodiment 2

Figure 8:
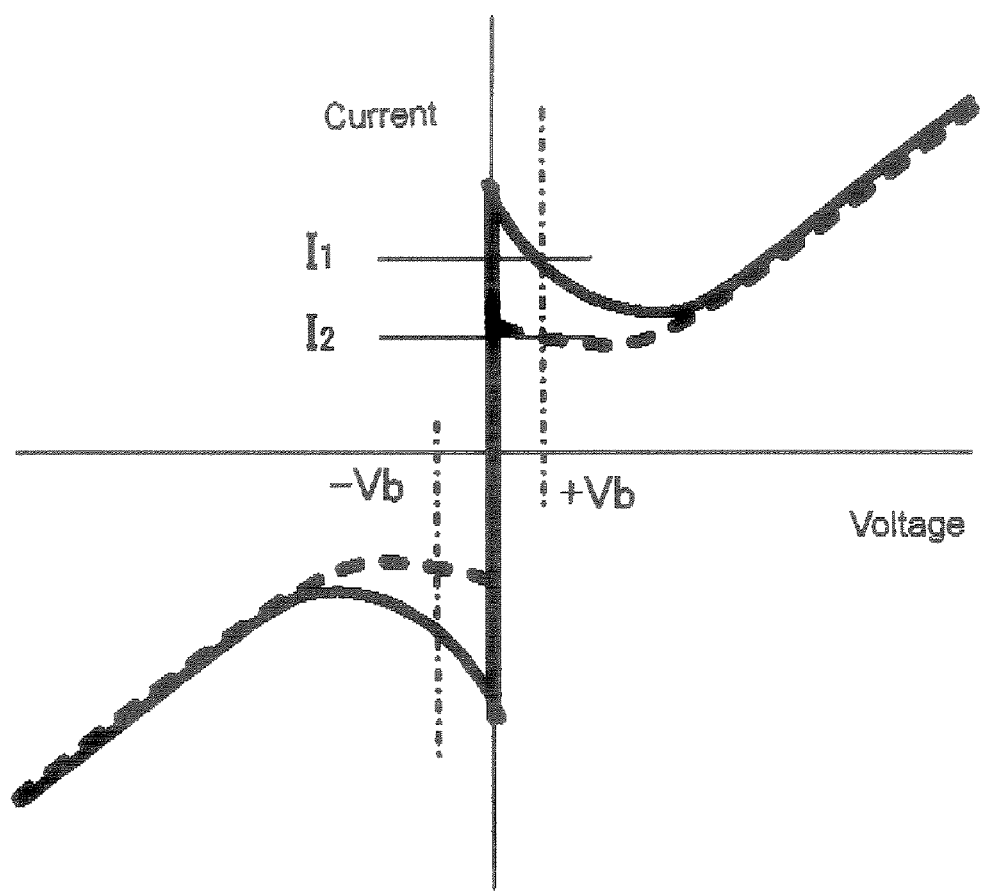
FIG. 8 is a drawing illustrating the bias point occurring during the detection of an electromagnetic wave.

FIG. 8 illustrates the positions of bias voltage occurring during the detection of an electromagnetic wave by the use of an electromagnetic detection element 10. When the bias voltage is set at such positions of small voltage as approximates closely to zero in the negative resistance region as illustrated in the drawing, the electric current is varied with high sensitivity as indicated by the dotted line/solid line of FIG. 8 by the on/off of the radiation of the electromagnetic wave. By enabling the voltage bias condition dilated to not less than several times to be secured by the series connection, it is rendered possible to implement practical bias setting and accomplish detection of an electromagnetic wave with high sensitivity.

When the frequency of the electromagnetic wave subjected to detection exceeds the energy gap between the first and second superconducting electrodes, the electromagnetic wave detection element consequently obtained can be made to utilize effectively the phenomenon that the superconducting electron-pairs undergo direct breakage that quasi-particles occur in a large quantity and that the superconducting electrode directly induces strong variation.

In this case, when the far infrared region not less than several μm (several μm to 200 μm) in wavelength is contemplated, the superconducting electrode prefers to measure 3 to 50 μm in size and possess such a structure as allows integration with an antenna and enables easy coupling with an electromagnetic wave substantially from the viewpoint of the processing technique in the electrode method.

Then when the electromagnetic wave of high energy in the infrared to ultraviolet region and further in the regions of X ray and γ ray is contemplated the detection element prefers to have a size of 2 to 10 μm allowing easy realization of the SNS (or SS'S) structure itself. What results in is that the mechanism capable of receiving photons of high energy on a plane and detecting the effect due to a strong on-equilibrium state formed of a large amount of quasi-particles excited consequently becomes predominant. The film thickness of the superconducting electrode is selected in the range of 50 to 300 nm. Since the penetration efficiency in the thin film grows in accordance as the energy of electromagnetic wave or particle increases it is commendable to select a rather larger film thickness in the range of 200 to 300 nm and in the infrared region, implement this selection in due consideration of the combination with such a film thickness as strongly manifests the non-equilibrium effect due to the incidence of photons in the neighborhood of 100 nm.

By having a multiplicity of serially connected electromagnetic wave detection elements of this invention disposed in a copiously wide range as compared with a wavelength as serially distributed so as to cover a large surface area it is rendered possible to realize an electromagnetic wave detector exhibiting high sensitivity and possessing a receiving surface of a large area.

Figure 13:
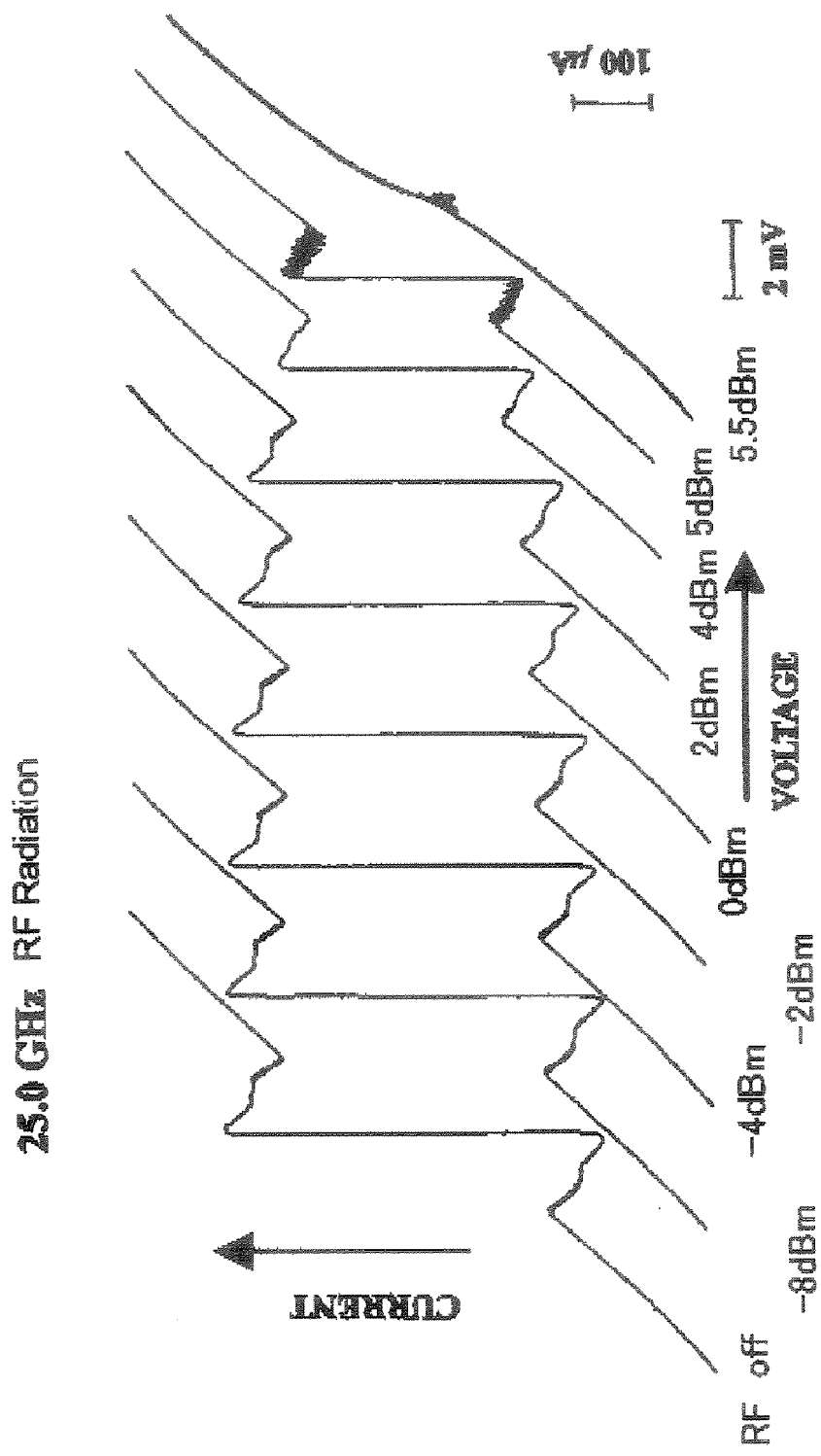
FIG. 13 is a drawing illustrating an example of experimental measurement by RF radiation.

An example of experimental measurement is illustrated in FIG. 13. This drawing depicts radiation of an electromagnetic wave of 25 GHz in the example of FIG. 12. FIG. 13 represents the current-voltage characteristic of a mesoscopic SNS junction.

Embodiment 3

Figure 9:
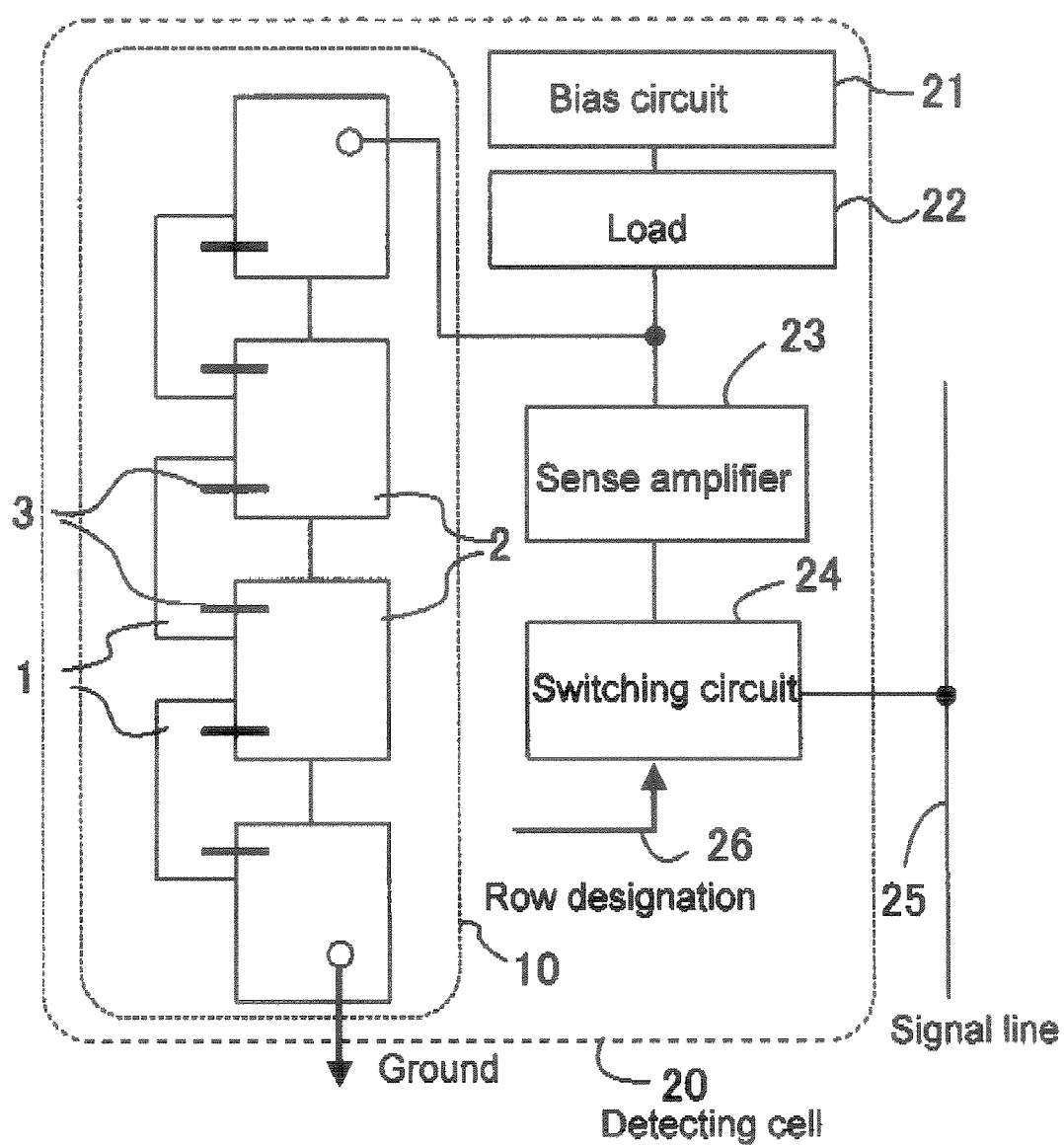
FIG. 9 is a drawing illustrating an example of structure of cells used for arrangement.

FIG. 9 is a block diagram depicting the case of configuring a detecting cell 20 using the electromagnetic detection elements 10. A bias voltage in the negative resistance region is applied as illustrated in FIG. 8 to the electromagnetic detection element 10 via a bias circuit 21 and the change in the electric current is detected by a sense amplifier 23 as transformed by a load 22 into a change in voltage. The output of the sense amplifier 23 is transmitted to a signal line via a switching circuit that is controlled with a signal for row address designation.

Figure 10:
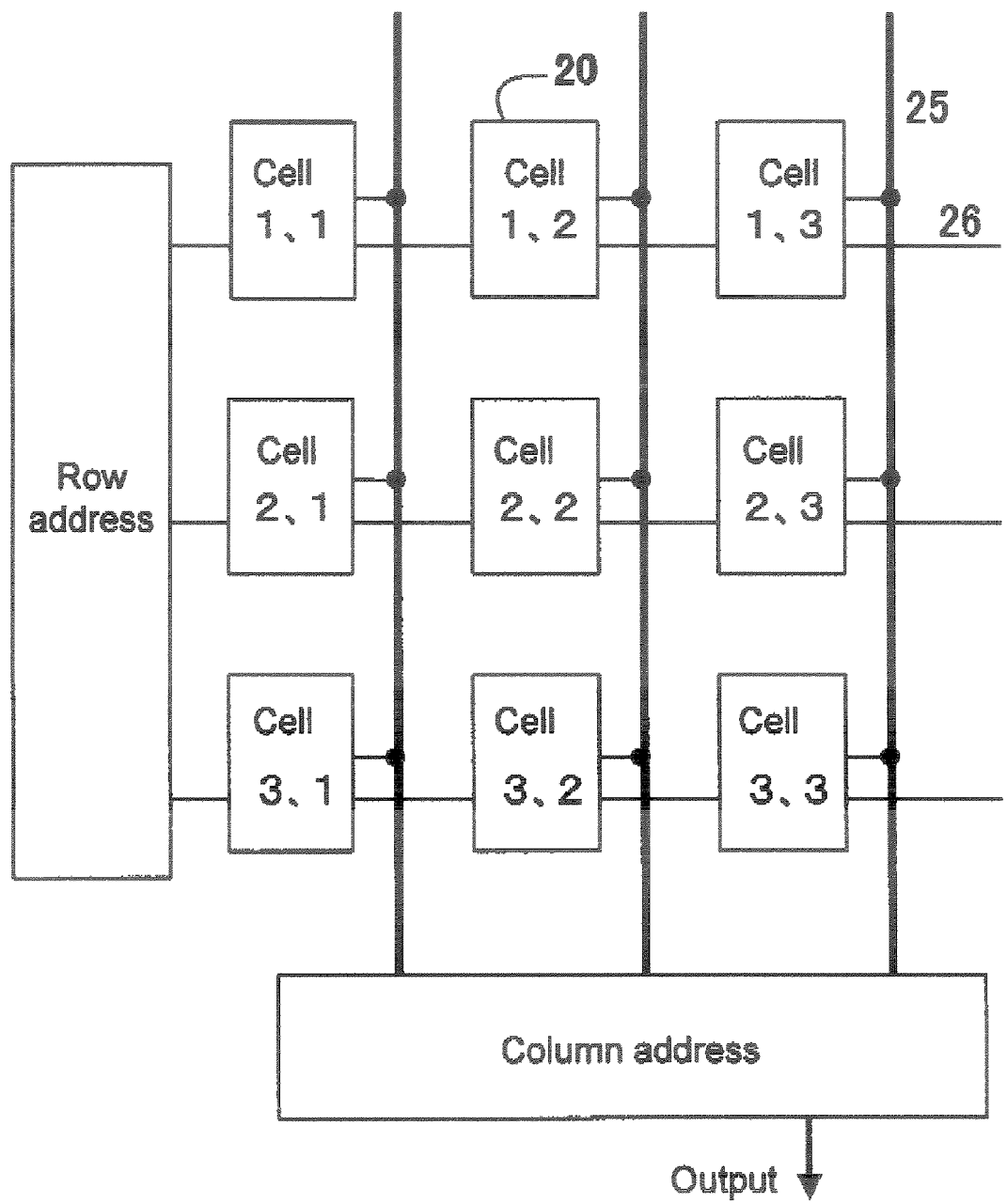
FIG. 10 is a drawing illustrating an example of the detector in two-dimensional arrangement.

The structure that results from arraying the detecting cells 20 of FIG. 9 in the shape of a matrix is illustrated in FIG. 10. FIG. 10 represent a matrix of 3×3. It is evident that the structure of 3×1 enables implementing one-dimensional detection. It is also evident that the resolution during the course of detection can be enhanced by adding to the number of detecting cells 20 within a fixed surface area owing to the use of detecting cells rendered small by giving a decreased size to the superconducting electrodes.

Embodiment 4

Figure 11:
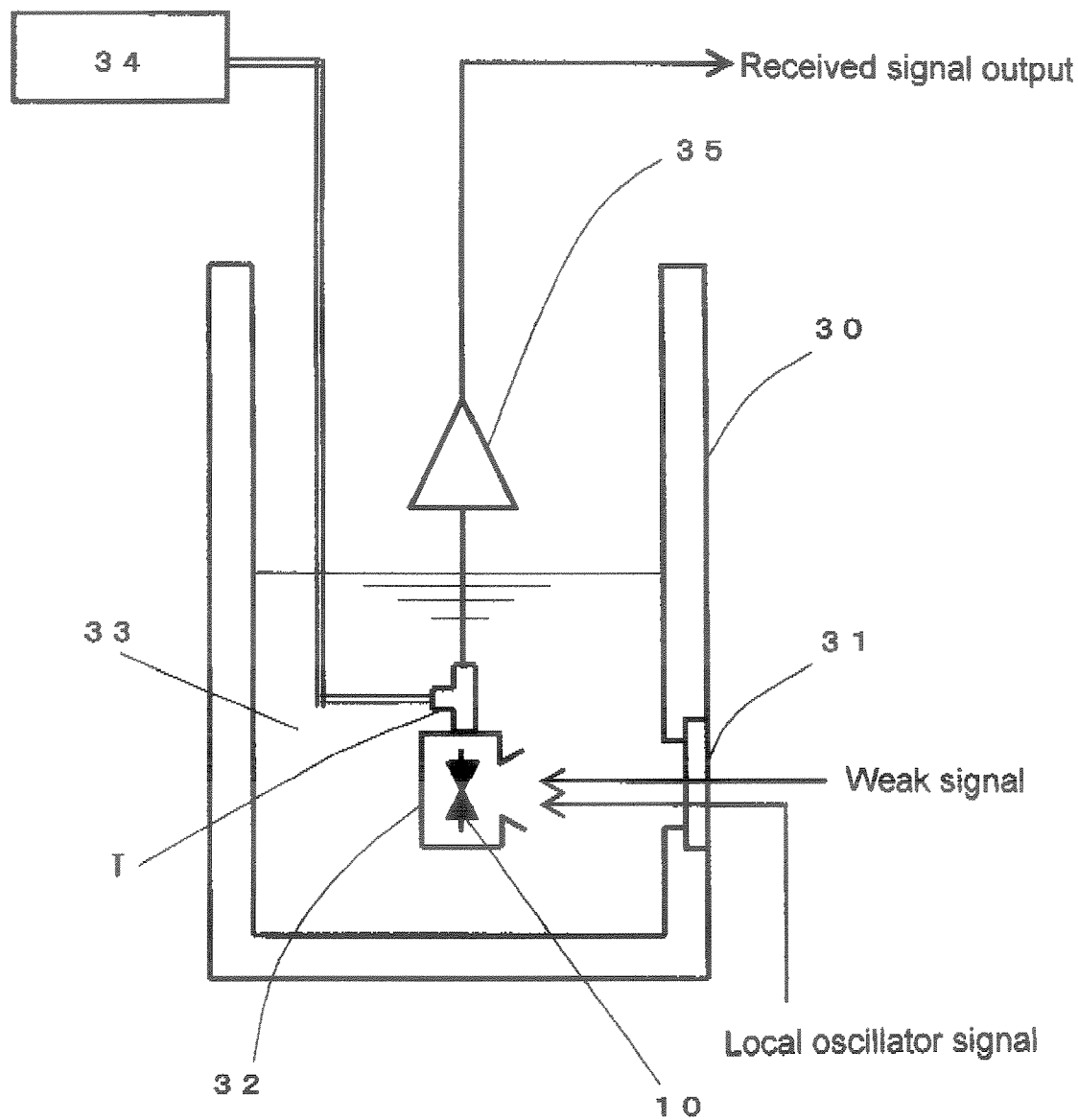
FIG. 11 is a drawing illustrating an example of using the element of this invention for frequency mixing.

The case of using the electromagnetic wave detection element 10 for mixing frequencies is illustrated in FIG. 11. The electromagnetic wave detection element 10 is cooled with liquefied helium 33 in an insulating vacuum container 30 provided in part of the wall surface thereof with a window 31 permeable to a local oscillator signal. The heterodyne detection is accomplished by combining a weak signal received by the electromagnetic wave detection element 10 and a local oscillator signal prepared on the receiver side, supplying a DC current via a low-region filter of bias T to the negative resistance region having a bias voltage source 34 set therein mixing frequencies by using the non-linear response property of the electromagnetic wave detection element 10 in a cooled mixer block 32 extracting a difference frequency signal component via a millimeter wave choke filter incorporated in the bias T and amplifying the extracted component with a low-noise amplifier 35, thereby acquiring a received signal output.

INDUSTRIAL APPLICABILITY

The utilization of the negative resistance of the element of this invention for amplifying an electromagnetic wave entails the indispensable condition that the mutual action of this negative resistance with the electromagnetic wave avoids rupturing the condition of superconductivity. It is nevertheless known that the destruction of superconductivity does not occur under the weak electromagnetic field application of a microwave of several GHz to several hundred GHz. Thus, the element can be used for amplifier of very low power in this wavelength region.

When the change in the superconducting current is detected in the form of electromagnetic wave as illustrated in FIG. 8, it is necessary that the state of superconductivity be broken in part of the detection element. It is known that this breaking is induced in the electromagnetic wave of a region having a shorter wavelength than the infrared ray. For the detection of such an electromagnetic wave as this, this invention can be applied.

While the foregoing description has been focused on the SNS structure, this invention allows using a superconductor film as the narrow line 3. Though this superconductor film may be formed of the same material as the superconductor 1 or 2, the selection of the film thickness of the narrow line 3 in the range of 5 to 50 nm enables the superconducting transition temperature Tc having a small energy gap to become low as compared with the Tc of the first and second superconducting electrodes. It is necessary that the energy band structure be varied in concert with the formation of a micro-fine structure. The consequence is the completion of the SS'S structure wherein S' denotes a superconductor that has varied the energy band structure. Since the change of the energy band structure of S' is an effect of microfine structure, it is susceptible of an external influence and sensitive to the dispersion of its own size. The effect of this invention is particularly important and conspicuous in the structure of this sort.

The invention claimed is:

1. An electromagnetic wave detection element comprising a plurality of structure units each comprising a flat and electrically insulating substrate,
    a first superconducting electrode disposed on the substrate,
    a second superconducting electrode opposed to an upper part of the first superconducting electrode,
    an insulating film not less than 5 nm and not more than 10 nm in thickness and sandwiched between the first and second superconducting electrodes, with parts of cross sections of the second superconducting electrode and insulating film formed on the upper part of the first superconducting electrode, and
    a normal conducting line not more than 100 nm in width, not more than 100 nm in thickness and passing just once through the cross sections of the second superconducting electrode and insulating film to form a sole weak link and establish electric connection of the first and second superconducting electrodes,
    wherein the first superconducting electrode of each of the structure units is serially connected to an adjacent second superconducting electrode, the first or second superconducting electrodes of opposite end units are connected to leading lines, and the cross sections of the insulating films allowing passage of the normal conducting lines are disposed so as to face a same direction with respect to the plurality of structure units laid throughout between the leading lines.

2. An electromagnetic wave detection element comprising:
    a plurality of structure units each comprising a flat substrate,
    a first superconducting electrode disposed on the substrate,
    a second superconducting electrode opposed to an upper part of the first superconducting electrode,
    an insulating film not less than 5 nm and not more than 10 nm in thickness and sandwiched between the first and second superconducting electrodes, with parts of cross sections of the second superconducting electrode and insulating film formed on the upper part of the first superconducting electrode, and
    a superconducting line not more than 100 nm in width, not more than 100 nm in thickness and passing just once through the cross sections of the second superconducting electrode and insulating film to form a sole weak link and establish electric connection of the first and second superconducting electrodes,
    wherein the first superconducting electrode of each of the structure units is serially connected to an adjacent second superconducting electrode, the first or second superconducting electrodes of opposite end units are connected to leading lines, and the cross sections of the insulating films allowing passage of the superconducting lines are disposed so as to face a same direction with respect to the plurality of structure units laid throughout between the leading lines.

3. An electromagnetic wave detection element according to claim 1 or claim 2, wherein the normal conducting or superconducting line has a smallest length for connecting the first and second superconducting electrodes that is 0.3 to 6 times the superconducting coherent length.

4. An electromagnetic wave detection element according to claim 2, wherein the weak link has a length in a range of 5 to 30 nm, a width in a range of 15 to 250 nm and a thickness in a range of 5 to 30 nm.

5. An electromagnetic wave detection element according to claim 1 or claim 2, wherein the weak link is made of a normal conductor or superconductor material.

6. An electromagnetic wave detection element according to claim 1 or claim 2, wherein the weak link is made of superconductor of niobium or niobium nitride, or normal conductor of copper, gold, tungsten, titanium, aluminum or bismuth.

7. An electromagnetic wave detection element according to claim 1 or claim 2, wherein the fabrication of a normal conductor lead line or a superconducting line forming the weak link with the second superconducting electrode is implemented by a process of fabrication utilizing a vector scanning-type electron beam exposure device and using scanning directions that are mutually perpendicular.

8. An electromagnetic wave detector comprising:
    the electromagnetic wave detection elements according to claim 2 arrayed one-dimensionally or two-dimensionally and irradiated with a target electromagnetic wave to be measured; and
    a sense amplifier that sequentially reads a voltage-current characteristic of each of the electromagnetic wave detection elements to perform one-dimensional or two-dimensional measurement of the target electromagnetic wave.

9. An electromagnetic wave detector using as a receiver the electromagnetic wave detection elements according to claim 2, wherein a received signal and a local oscillator signal generated on a side of the receiver are supplied as overlapped on a bias voltage to the electromagnetic wave detection elements, a non-linear response property of the electromagnetic wave detection elements is used to mix the signals, and a difference frequency between the received signal and the locally oscillating signal is selected and amplified to perform heterodyne detection.

10. An electromagnetic wave detector using the electromagnetic wave detection elements according to claim 2, wherein a superconducting line linking the first and second superconducting electrodes is retained in a state of superconductivity at a temperature approximating closely to a superconducting transition temperature to induce a strong non-equilibrium state fated to become a critical state in an extremely small weak link region due to linking with the electromagnetic wave signal, thereby detecting an electromagnetic wave with high sensitivity.

11. An electromagnetic wave detector using as a receiver the electromagnetic wave detection element according to claim 2, wherein a received signal and a local oscillator signal generated on a side of the receiver are supplied as overlapped on a bias voltage and combined with adjustment of an electric power of the local oscillator signal, a superconducting line connecting the first and second superconducting electrodes is retained in a state of superconductivity at a temperature approximating closely to a superconducting transition temperature to induce a strong non-equilibrium state fated to become a critical state in an extremely small weak link region due to linking with the electromagnetic wave signal, a non-linear response property of the electromagnetic wave detection element is used to mix the signals, a difference frequency between the received signal and the logically oscillating signal is selected from the mixed signal and amplified, thereby making heterodyne detection of an electromagnetic wave.

* * * * *